(12) United States Patent
Sun

(10) Patent No.: US 7,362,624 B2
(45) Date of Patent: Apr. 22, 2008

(54) TRANSISTOR LEVEL SHIFTER CIRCUIT

(75) Inventor: Wein-Town Sun, Taoyuan County (TW)

(73) Assignee: AU Optronics Corp., Hsinchu (TW)

( * ) Notice: Subject to any disclaimer, the term of this patent is extended or adjusted under 35 U.S.C. 154(b) by 159 days.

(21) Appl. No.: 11/426,129

(22) Filed: Jun. 23, 2006

(65) Prior Publication Data

US 2007/0171734 A1 Jul. 26, 2007

(30) Foreign Application Priority Data

Jan. 24, 2006 (TW) .............. 95102596 A

(51) Int. Cl.
*G11C 7/00* (2006.01)
(52) U.S. Cl. .............. 365/189.11; 365/233; 365/202; 365/190
(58) Field of Classification Search .......... 365/189.11, 365/233, 202, 190; 327/333
See application file for complete search history.

(56) References Cited

U.S. PATENT DOCUMENTS

| | | | |
|---|---|---|---|
| 5,881,000 A * | 3/1999 | Maeda ........... | 365/189.09 |
| 6,300,796 B1 | 10/2001 | Troutman et al. | |
| 6,449,204 B1 * | 9/2002 | Arimoto et al. .......... | 365/222 |
| 6,563,744 B2 * | 5/2003 | Kuroki ............ | 365/189.05 |
| 6,600,357 B1 | 7/2003 | Kirihara | |
| 6,917,236 B2 * | 7/2005 | Doutreloigne et al. ...... | 327/333 |
| 6,922,095 B2 | 7/2005 | Chiu | |
| 7,026,855 B2 * | 4/2006 | Sueoka et al. .......... | 327/333 |
| 2004/0021496 A1 | 2/2004 | Shin | |
| 2004/0084696 A1 | 5/2004 | Chiu | |

* cited by examiner

*Primary Examiner*—Tuan T Nguyen
(74) *Attorney, Agent, or Firm*—Grossman Tucker Perreault & Pfleger PLLC

(57) ABSTRACT

A transistor level shifter circuit constituted by a plurality of PMOS TFT is included. The transistor level shifter circuit primarily includes a conversion circuit, a first amplifier circuit, and a second amplifier circuit. With the simplified circuit arrangement and a smaller quantity of required transistors, the transistor level shifter circuit is adapted to operate efficiency under both high RC load and frequency.

12 Claims, 7 Drawing Sheets

TRANSISTOR LEVEL SHIFTER CIRCUIT

This application benefits from the priority based on Taiwan Patent Application No. 095102596 filed on Jan. 24, 2006.

CROSS REFERENCES TO RELATED APPLICATIONS

Not applicable.

BACKGROUND OF THE INVENTION

1. Field of the Invention

The present invention relates to a transistor level shifter circuit, specifically to a transistor level shifter circuit implemented by thin-film transistor of the same type.

2. Descriptions of the Related Art

Thin-Film Transistor Liquid Crystal Display (TFT LCD) has been widely used in applications such as personal computer display, television, digital camera, and mobile phones. Single process technique, i.e. the PMOS process, is usually adopted in the production of TFT array. Complicated NMOS process is avoided in order to simplify the manufacturing procedure and reduce the cost of the production. When a TFT LCD array operates, it requires a clock signal to scan the TFT LCD array in order to store data to be displayed as pixels of the TFT LCD in sequence. Since the voltage level of the clock signal used for scanning and the voltage level used by the TFT are different, a low-voltage clock signal with general logical level has to pass a peripheral drive circuit to transform voltage level in order to drive the TFT array circuit directly.

FIG. 1 is a circuit diagram of a level shifter of the prior art. The level shifter is composed of PMOS and is used to amplify signals with small amplitudes to signals with great amplitudes. It is a level shifter with one-stage amplification. According to simulation and practical measurement, the rise time and fall time of signals are overlong. Consequently, it is not suitable for an environment with great load and high frequency.

Although the level shifter disclosed in U.S. Pat. No. 6,922,095 also adopts transistors of the same type, the architecture of the circuit and the connection method are complicated.

In U.S. Pat. Nos. 6,300,796 and 6,600,357, a complementary metal oxide semiconductor (CMOS) process is adopted. Since it is a complicated process, the cost is high and it cannot be integrated in a single PMOS process. Furthermore, its architecture and the connection method are getting complicated.

According to the above description, if implementing transistor level shifter circuit by techniques of the prior art, the required time to convert signals are overlong and greater loads cannot be driven. If using a CMOS process to produce transistor level shifter circuit, the cost is high and the process cannot be integrated. Consequently, how to use a single process with low cost to integrate the manufacturing procedure of TFT and transistor level shifter circuit and how to increase the operation speed and have greater loads are key issues for TFT LCD design.

SUMMARY OF THE INVENTION

One objective of this invention is to provide a transistor level shifter circuit, which is configured between a first power source and a second power source. The voltage level of the first power source is greater than the voltage level of the second power source. The level shifter circuit is used to amplify the voltage level of a first pair of complementary signals comprising a clock signal and an inverse clock signal. The transistor level shifter circuit comprises a transforming circuit, a first amplifying circuit, and a second amplifying circuit. The transforming circuit is used to receive the first pair of complementary signals and to generate a second pair of complementary signals after. The voltage level of the second pair of complementary signals is substantially between the voltage level of the first power source and the difference of the voltage level of the first pair of complementary signals and the voltage level of the first power source. The first amplifying circuit is used to generate a first stage output signal after amplifying the second pair of complementary signals. The voltage level of the first stage output signal is substantially between zero and the voltage level of the first power source. The second amplifying circuit is used to amplify the first stage output signal and to generate an output signal. The voltage level of the output signal is substantially between the voltage level of the first power source and the voltage level of the second power source.

Another objective of this invention is to manufacture a transistor level shifter circuit by transistors of the same type and to generate capacitor with analog coupling signals so that the transistor level shifter circuit can be integrated into the single process of the TFT. The transistor level shifter circuit of this invention uses a transforming circuit to transform an inputted pair of complementary signals with low voltage level into another pair of complementary signals with higher voltage level in order to control the first amplifying circuit. The amplified output voltage of the first amplifying circuit is used to control the second amplifying circuit. By the gradually amplifying process, the operation speed of the transistor level shifter circuit of this invention can be increased and great load can be driven. Consequently, most problems of the prior art can be solved.

The detailed technology and preferred embodiments implemented for the subject invention are described in the following paragraphs accompanying the appended drawings for people skilled in this field to well appreciate the features of the claimed invention.

DESCRIPTION OF THE PREFERRED EMBODIMENT

Figure 1:
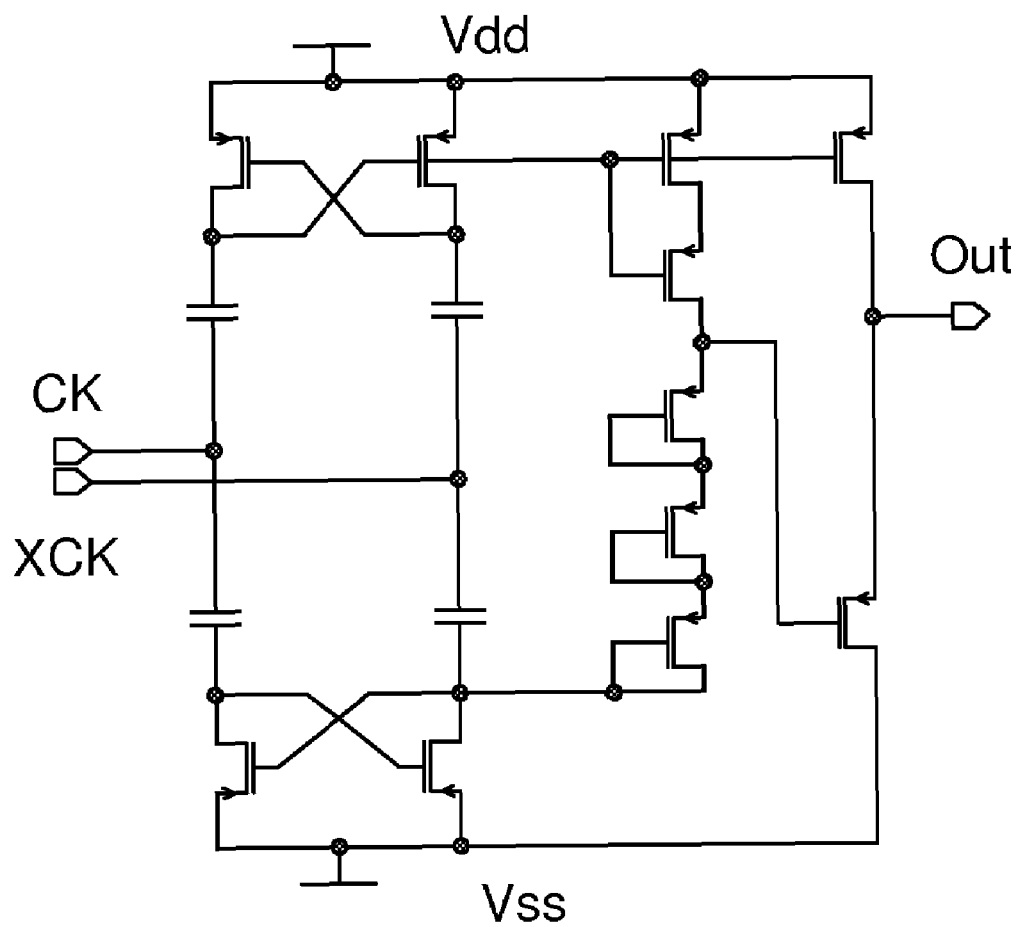
FIG. 1 is a circuit diagram of a level shifter of the prior art.
Figure 2A:
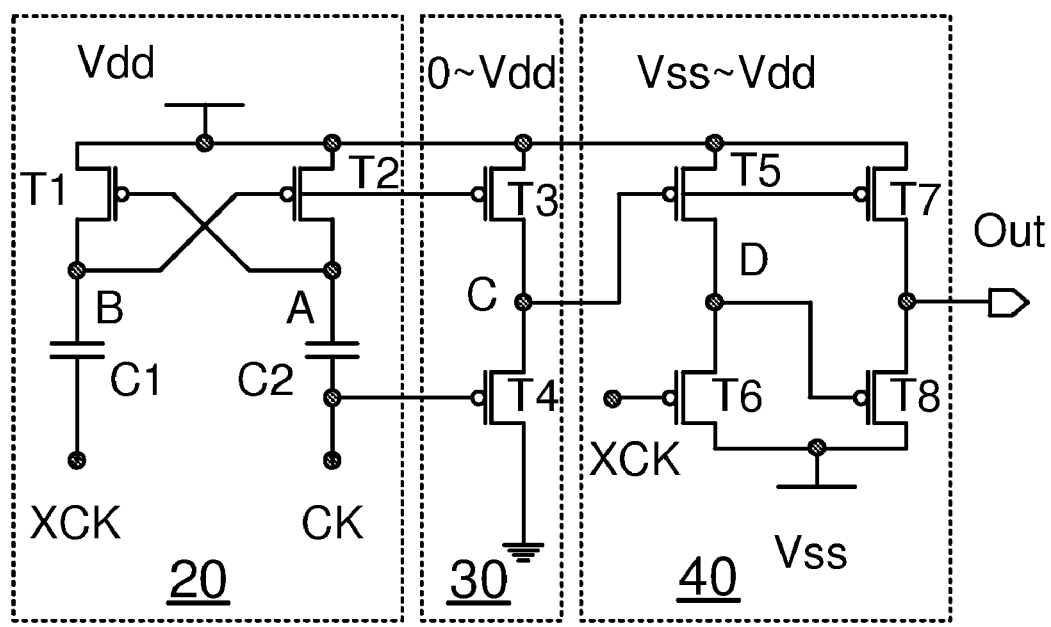
FIG. 2A is a circuit diagram of a transistor level shifter circuit of a first embodiment of this invention.

FIG. 2A is a circuit diagram of a transistor level shifter circuit of a preferred embodiment of this invention. The transistor level shifter circuit is configured between a first power source and a second power source. The voltage level of the first power source is greater than the voltage level of the second power source. The level shifter circuit is used to amplify the voltage level of a first pair of complementary signals comprising a clock signal and an inverse clock signal. The transistor level shifter circuit comprises a transforming circuit 20, a first amplifying circuit 30, and a second amplifying circuit 40. The transforming circuit 20 is used to receive the first pair of complementary signals and to generate a second pair of complementary signals. The voltage level of the second pair of complementary signal is substantially between the voltage level of the first power source and the difference of the voltage level of the first pair of complementary signals and the voltage level of the first power source. The first amplifying circuit 30 is used to amplify the second pair of complementary signals and to generate a first stage output signal. The voltage level of the first stage output signal is substantially between zero and the voltage level of the first power source. The second amplifying circuit is used to amplify the first stage output signal and to generate an output signal. The voltage level of the output signal is substantially between the voltage level of the first power source and the voltage level of the second power source.

The transforming circuit 20 comprises a first transistor (T1), a second transistor (T2), a first capacitor (C1), and a second capacitor (C2). The first transistor (T1) has a first electrode, a second electrode, and a gate. The first electrode is coupled with the first power source. The second transistor (T2) has a first electrode, a second electrode, and a gate. The gate of the second transistor (T2) is coupled with the second electrode of the first transistor (T1). The first electrode of the second transistor (T2) is coupled with the first power source. The second electrode of the second transistor (T2) is coupled with the gate of the first transistor (T1). The second electrode of the first transistor (T1) receives the inverse clock signal through the first capacitor (C1). The second electrode of the second transistor (T2) receives the clock signal through the second capacitor (C2).

The first amplifying circuit 30 comprises a third transistor (T3) and a fourth transistor (T4). The third transistor (T3) has a first electrode, a second electrode, and a gate. The gate of the third transistor (T3) is coupled with the second electrode of the first transistor (T1). The first electrode of the third transistor (T3) is coupled with the first power source. The fourth transistor (T4) has a first electrode, a second electrode, and a gate. The gate of the fourth transistor (T4) receives the clock signal. The first electrode of the fourth transistor (T4) is coupled with the second electrode of the third transistor (T3). The second electrode of the fourth transistor (T4) is substantially grounded.

The second amplifying circuit 40 comprises a fifth transistor (T5), a sixth transistor (T6), a seventh transistor (T7), and an eighth transistor (T8). The fifth transistor (T5) has a first electrode, a second electrode, and a gate. The gate of the fifth transistor (T5) is coupled with the second electrode of the third transistor (T3). The first electrode of the fifth transistor (T5) is coupled with the first power source. The sixth transistor (T6) has a first electrode, a second electrode, and a gate. The gate of the sixth transistor (T6) receives the inverse clock signal. The first electrode of the sixth transistor (T6) is coupled with the second electrode of the fifth transistor (T5). The second electrode of the sixth transistor (T6) is coupled with the second power source. The seventh transistor (T7) has a first electrode, a second electrode, and a gate. The gate of the seventh transistor (T7) is coupled with the second electrode of the third transistor (T3). The first electrode of the seventh transistor (T7) is coupled with the first power source. The second electrode of the seventh transistor (T7) outputs the output signal. The eighth transistor (T8) has a first electrode, a second electrode, and a gate. The gate of the eighth transistor (T8) is coupled with the second electrode of the fifth transistor (T5). The first electrode of the eighth transistor (T8) is coupled with the second electrode of the seventh transistor (T7). The second electrode of the eighth transistor (T8) is coupled with the second power source.

Figure 2B:
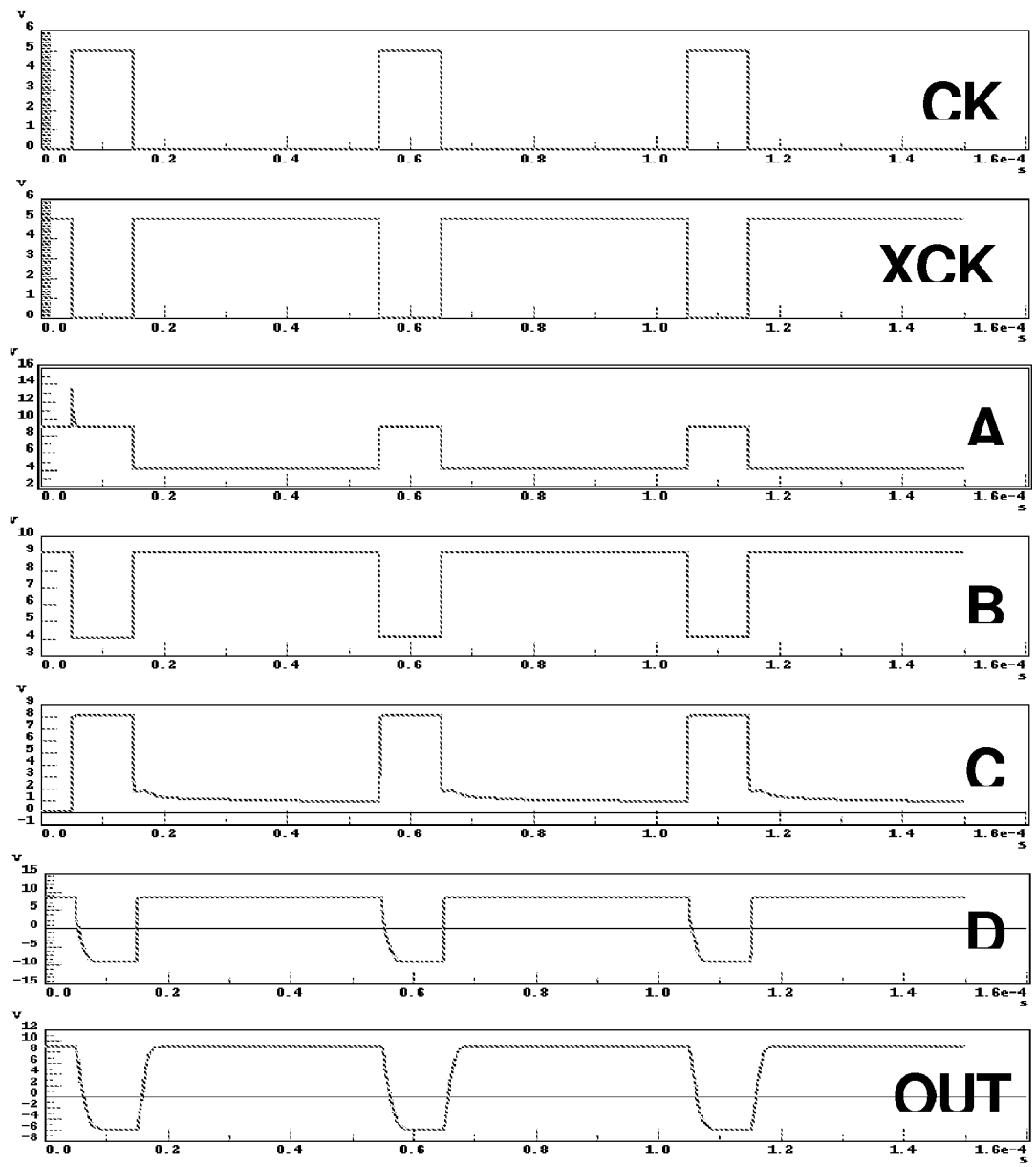
FIG. 2B is a simulated oscillogram of the input/output signals of the transistor level shifter circuit of the first embodiment of this invention.

During operation, the first pair of complementary signals, CK and XCK, as shown in FIG. 2B are generated. FIG. 2B is a simulated oscillogram of the input/output signals of the transistor level shifter circuit of the preferred embodiment of this invention. Using signals with logical levels +5V and 0V as the first pair of complementary signals, when the clock signal changes from 0V to +5V, the inverse clock signal changes from +5V to 0V. When the two signals change, the first pair of complementary signals enters the transforming circuit 20 through the first capacitor (C1) and the second capacitor (C2) by AC coupling simultaneously. At this time, point A and point B receive ±5V voltage changes of the first pair of complementary signals, wherein +5V is for the former and −5V is for the latter. Since both the first electrode of the first transistor (T1) and the first electrode of the second transistor (T2) are coupled with the first power source, under the simulation condition being 9V, the voltage changes of point A and point B are from +4V to +9V and from +9V to +4V, respectively. At this time, since the voltage connected to the gate of the fourth transistor (T4) is 5V so that the fourth transistor (T4) is unable to be conducted and since the voltage at point B is less than the first power source so that the third transistor (T3) is conducted, the voltage of point C is substantially 9V. Consequently, the fifth transistor (T5) and the seventh transistor (T7) are not conducted. Since the sixth transistor (T6) is conducted due to the change from +5V to 0V of the inverse clock signal, the voltage of point D descends and the eighth transistor (T8) is conducted to output the second power source with voltage −6V.

Conversely, when the clock signal transforms from +5V to 0V and the inverse clock signal changes from 0V to +5V simultaneously, the voltage of point A changes from +9V to +4V and the voltage of point B changes from +4V to +9V. Since the voltage of point B is +9V so that the third transistor (T3) cannot be conducted and since the clock signal connected to the gate of the fourth transistor (T4) is 0V so that the fourth transistor (T4) is conducted, the voltage of point C is substantially equivalent to 0V. Since the inverse clock signal connected to the gate of the sixth transistor (T6) is +5V so that the sixth transistor (T6) cannot be conducted and since the voltage of point C connected the gate of the fifth transistor (T5) is substantially 0V so that the fifth transistor (T5) is conducted, the voltage level of the point D is substantially +9V. Similarly, since the eighth transistor (T8) cannot be conducted and the seventh transistor (T7) can be conducted, the output voltage of the first power source is +9V.

Figure 2C:
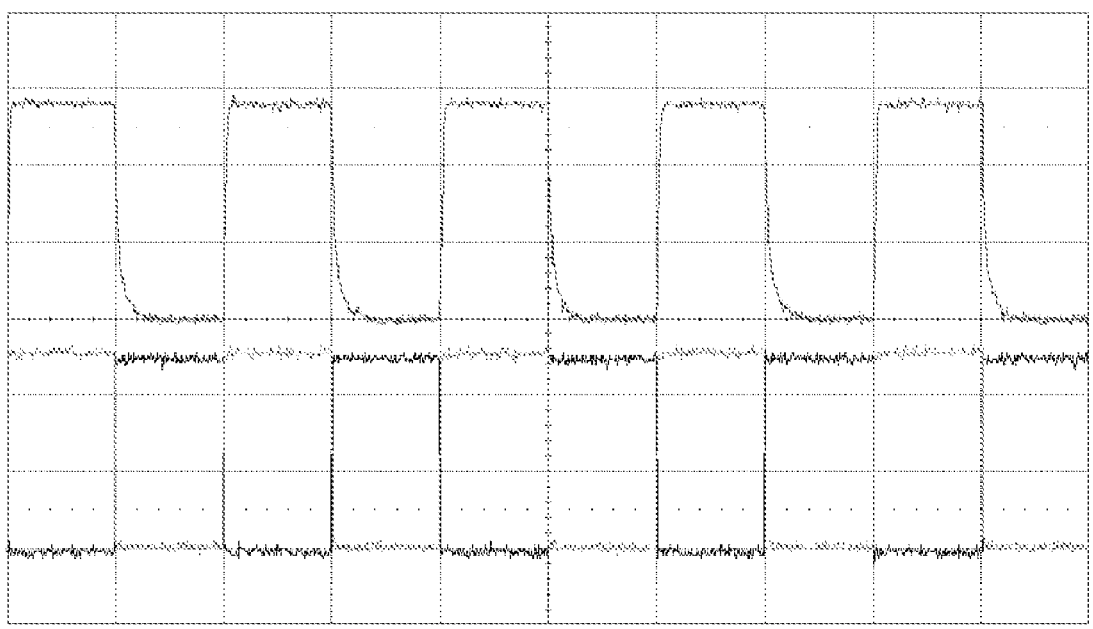
FIG. 2C is a oscillogram of the input/output signals measured by equipment of the transistor level shifter circuit of the first embodiment of this invention.

From the simulation result of the circuit, it is known that when the load resistance is 1000 Ohm and the load capacitor is 50 pF, the maximal transient time is shorter than 2.5 microseconds. FIG. 2C is an oscillogram of the input/output signals measured by equipment of the transistor level shifter circuit of the preferred embodiment of this invention. The X axis indicates the timing, the Y axis indicates the measured voltage value, the bottom diagram of FIG. 2C shows the first pair of the complementary signals, and the upper diagram of FIG. 2C shows the output signals of voltages between +9V and −6V. The figure shows that the transistor level shifter circuit can still operate rapidly under great load. Consequently, the problems of the prior art can be improved.

Figure 3:
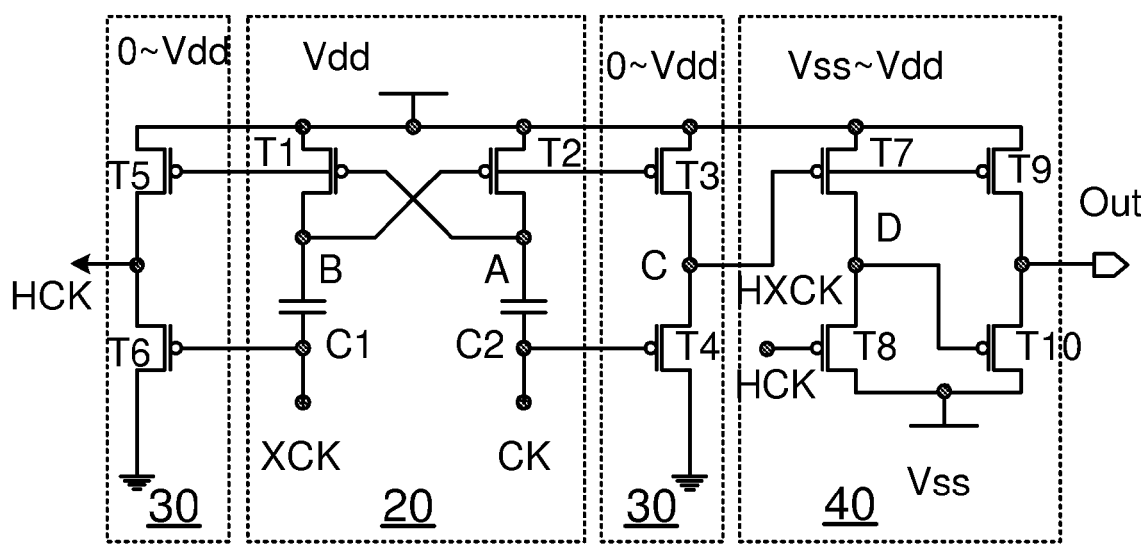
FIG. 3 is a circuit diagram of a transistor level shifter circuit of a second embodiment of this invention.

FIG. 3 is another preferred embodiment of this invention, which is a circuit diagram of a transistor level shifter circuit with a difference control. The difference between the embodiments of FIG. 3 and FIG. 2A is the first amplifying circuit 30 and the second amplifying circuit 40. In FIG. 3, there is one additional amplifying circuit 30 to amplify the inverse clock signal to signal HCK in order to control the second amplifying circuit 40. As to the second amplifying circuit 40, the differences between FIG. 2A and FIG. 3 includes the numbering of transistors caused by the transistors added by another additional amplifying circuit 30, and moreover, the gate of one transistor in FIG. 3 is connected to the HCK signal.

Compared with FIG. 2A, the connection differences are detailed in the following. The first amplifying circuit 30 further comprises a fifth transistor (T5) and a sixth transistor (T6). The fifth transistor (T5) has a first electrode, a second electrode, and a gate. The gate of the fifth transistor (T5) is coupled with the second electrode of the second transistor (T2). The first electrode of the fifth transistor (T5) is coupled with the first power source. The sixth transistor (T6) has a first electrode, a second electrode, and a gate. The gate of the sixth transistor (T6) receives the inverse clock signal XCK. The first electrode of the sixth transistor (T6) is coupled with the second electrode of the fifth transistor (T5). The second electrode of the sixth transistor (T6) is substantially grounded. Besides renumbering the transistors of the second amplifying circuit 40 from the fifth to the eighth in FIG. 2A to from the seventh to the tenth in FIG. 3, the gate of the renumbered eighth transistor (T8) is coupled with the second electrode of the fifth transistor (T5). By doing so, the inverse clock signal XCK is amplified to HCK and is then connected to the gate of the eighth transistor (T8) of the second amplifying circuit 40. Thus, the output signal of the second amplifying circuit 40 can be easily obtained even under great load.

Figure 4:
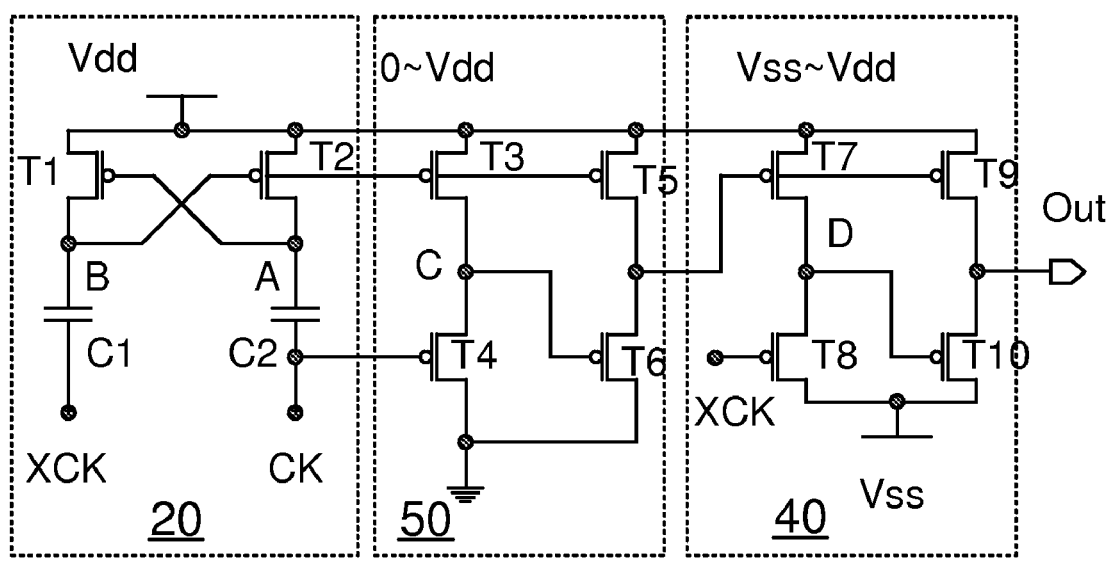
FIG. 4 is a circuit diagram of a transistor level shifter circuit of a third embodiment of this invention.

FIG. 4 is another preferred embodiment of this invention, which is a circuit diagram of a transistor level shifter circuit with a buffer. The transistor level shifter circuit comprises a transforming circuit 20, a first amplifying circuit 50, and a second amplifying circuit 40. The transforming circuit 20 is the same as described in the embodiment of FIG. 2A, so it is not repeated here. There are some adjustments of the second amplifying circuit 40. In addition, the first amplifying circuit 50 is different. To be more specific, the first amplifying circuit 50 is the first amplifying circuit 30 in FIG. 2A with an additional buffer. Thus, the first amplifying circuit 50 has stronger drive power to prevent point C from enabling the second amplifying circuit 40. Thus, the operating speed of the transistor level shifter circuit can be increased.

The connection differences between embodiments of FIG. 4 and of FIG. 2A are described in the following. In addition to the first amplifying circuit 30 in FIG. 2A, the first amplifying circuit 50 further comprises a fifth transistor (T5) and a sixth transistor (T6). The fifth transistor (T5) has a first electrode, a second electrode, and a gate. The gate of the fifth transistor (T5) is coupled with the second electrode of the first transistor (T1). The first electrode of the fifth transistor (T5) is coupled with the first power source. The sixth transistor (T6) has a first electrode, the second electrode, and a gate. The gate of the sixth transistor (T6) is coupled with the second electrode of the third transistor (T3). The first electrode of the sixth transistor (T6) is coupled with the second electrode of the fifth transistor (T5). The second electrode of the sixth transistor (T6) is substantially grounded. As to the second amplifying circuit 40, renumbering the transistors of the second amplifying circuit 40 from the fifth to the eighth in FIG. 2A, to from the seventh to the tenth in FIG. 4. Moreover, the gate of the renumbered seventh transistor (T7) is coupled with the second electrode of the fifth transistor (T5).

Figure 5:
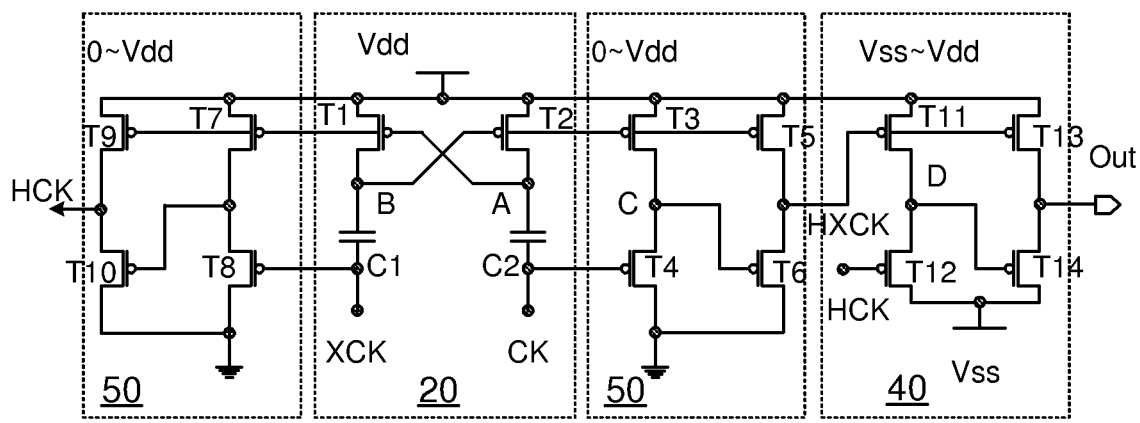
FIG. 5 is a circuit diagram of a transistor level shifter circuit of a fourth embodiment of this invention.

FIG. 5 shows another preferred embodiment of this invention, which is a circuit diagram of a transistor level shifter diagram. The transistor level shifter diagram comprises a transforming circuit 20, a first amplifying circuit 50, and a second amplifying circuit 40. Compared with the embodiment of FIG. 4, the transforming circuit 20 of this embodiment is the same as that of in FIG. 4, the first amplifying circuit 50 comprises additional four transistors, and there exists some adjustments in the second amplifying circuit 40. The four additional transistors in the first amplifying circuit 50 are used as buffers of the inverse clock signal. By doing so, the inverse clock signal is amplified to drive the second amplifying circuit 40 through the buffer. Consequently, the transistor level shifter circuit has greater voltage operation range and faster operation speed. Further, the power consumption is reduced.

The connection method of FIG. 5 differs from the connection method of FIG. 4 in the following ways. In FIG. 5, the first amplifying circuit 50 comprises a seventh transistor (T7), an eighth transistor (T8), a ninth transistor (T9), and a tenth transistor (T10). The seventh transistor (T7) has a first electrode, a second electrode, and a gate. The gate of the seventh transistor (T7) is coupled with the second electrode of the second transistor (T2). The first electrode of the seventh transistor (T7) is coupled with the first power source. The eighth transistor (T8) has a first electrode, a second electrode, and a gate. The gate of the eighth transistor (T8) receives the inverse clock signal XCK. The first electrode of the eighth transistor (T8) is coupled with the second electrode of the seventh transistor (T7). The second electrode of the eighth transistor (T8) is substantially grounded. The ninth transistor (T9) has a first electrode, a second electrode, and a gate. The gate of the ninth transistor (T9) is coupled with the second electrode of the second transistor (T2). The first electrode of the ninth transistor (T9) is coupled with the first power source. The tenth transistor (T10) has a first electrode, a second electrode, and a gate. The gate of the tenth transistor (T10) is coupled with the second electrode of the seventh transistor (T7). The first electrode of the tenth transistor (T10) is coupled with the second electrode of the ninth transistor (T9). The second electrode of the tenth transistor (T10) is substantially grounded. As to the second amplifying circuit 40, it is similar to the description of the embodiment in FIG. 4. The difference between them is to renumber the transistors of the second amplifying circuit 40 from the seventh to the tenth to from the eleventh to the fourteenth, and thus, the twelfth transistor (T12) after renumbering is coupled with the second electrode of the ninth transistor.

The above embodiments are used as the examples of the subject invention and used to explain the technical characters of the subject invention and are not used to limit the range of the subject invention. People skilled in this field may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

What is claimed is:

1. A transistor level shifter circuit configured between a first power source and a second power source, the voltage level of the first power source being greater than the voltage level of the second power source, the level shifter circuit being used to amplify the voltage level of a first pair of complementary signals, the first pair of complementary signals comprising a clock signal and an inverse clock signal, the transistor level shifter circuit comprising:

a transforming circuit for receiving the first pair of complementary signals and generating a second pair of complementary signals, the voltage level of the second pair of complementary signals being substantially between the voltage level of the first power source and the difference of the voltage level of the first pair of complementary signals and the voltage level of the first power source;

a first amplifying circuit for amplifying the second pair of complementary signals and generating a first stage output signal, the voltage level of the first stage output signal being substantially between zero and the voltage level of the first power source; and a second amplifying circuit for amplifying the first stage output signal and generating an output signal, the voltage level of the output signal being substantially between the voltage level of the first power source and the voltage level of the second power source.

2. The transistor level shifter circuit of claim 1, wherein the transforming circuit comprises:

a first transistor having a first electrode, a second electrode, and a gate and the first electrode being coupled with the first power source; and a second transistor having a first electrode, a second electrode, and a gate, the gate of the second transistor being coupled with the second electrode of the first transistor, the first electrode of the second transistor being coupled with the first power source, and the second electrode of the second transistor being coupled with the gate of the first transistor.

3. The transistor level shifter circuit of claim 2, wherein the second electrode of the first transistor responds to the inverse clock signal, and the second electrode of the second transistor responds to the clock signal.

4. The transistor level shifter circuit of claim 3, wherein the transforming circuit further comprises a first capacitor and a second capacitor, the second electrode of the first transistor receives the inverse clock signal through the first capacitor, and the second electrode of the second transistor receives the clock signal through the second capacitor.

5. The transistor level shifter circuit of claim 2, wherein the first amplifying circuit comprises:

a third transistor having a first electrode, a second electrode, and a gate, the gate of the third transistor being coupled with the second electrode of the first transistor, the first electrode of the third transistor being coupled with the first power source; and a fourth transistor having a first electrode, a second electrode, and a gate, the gate of the fourth transistor receiving the clock signal, the first electrode of the fourth transistor being coupled with the second electrode of the third transistor, and the second electrode of the fourth transistor being substantially grounded.

6. The transistor level shifter circuit of claim 5, wherein the second amplifying circuit comprises:

a fifth transistor having a first electrode, a second electrode, and a gate, the gate of the fifth transistor being coupled with the second electrode of the third transistor, the first electrode of the fifth transistor being coupled with the first power source;

a sixth transistor having a first electrode, a second electrode, and a gate, the gate of the sixth transistor receiving the inverse clock signal, the first electrode of the sixth transistor being coupled with the second electrode of the fifth transistor, and the second electrode of the sixth transistor being coupled with the second power source;

a seventh transistor having a first electrode, a second electrode, and a gate, the gate of the seventh transistor being coupled with the second electrode of the third transistor, the first electrode of the seventh transistor being coupled with the first power source, and the second electrode of the seventh transistor outputting the output signal; and an eighth transistor having a first electrode, a second electrode, and a gate, the gate of the eighth transistor being coupled with the second electrode of the fifth transistor, the first electrode of the eighth transistor being coupled with the second electrode of the fifth transistor, the first electrode of the eighth transistor being coupled with the second electrode of the seventh transistor, and the second electrode of the eighth transistor being coupled with the second power source.

7. The transistor level shifter circuit of claim 5, wherein the first amplifying circuit comprises:

a fifth transistor having a first electrode, a second electrode, and a gate, the gate of the fifth transistor being coupled with the second electrode of the second transistor, the first electrode of the fifth transistor being coupled with the first power source; and a sixth transistor having a first electrode, a second electrode, and a gate, the gate of the sixth transistor receiving the inverse clock signal, the first electrode of the sixth transistor being coupled with the second electrode of the fifth transistor, and the second electrode of the sixth transistor being substantially grounded.

8. The transistor level shifter circuit of claim 7, wherein the second amplifying circuit comprises:

a seventh transistor having a first electrode, a second electrode, and a gate, the gate of the seventh transistor being coupled with the second electrode of the third transistor, and the first electrode of the seventh transistor being coupled with the first power source;

an eighth transistor having a first electrode, a second electrode, and a gate, the gate of the eighth transistor being coupled with the second electrode of the fifth transistor, the first electrode of the eighth transistor being coupled with the second electrode of the seventh transistor, and the second electrode of the eighth transistor being coupled with the second power source;

a ninth transistor having a first electrode, a second electrode, and a gate, the gate of the ninth transistor being coupled with the second electrode of the third transistor, the first electrode of the ninth transistor being coupled with the first power source, and the second electrode of the ninth transistor outputting the output signal; and a tenth transistor having a first electrode, a second electrode, and a gate, the gate of the tenth transistor being coupled with the second electrode of the seventh transistor, the first electrode of the tenth transistor being coupled with the second electrode of the ninth transistor, and the second electrode of the tenth transistor being coupled with the second power source.

9. The transistor level shifter circuit of claim 5, wherein the first amplifying circuit comprises:
   a fifth transistor having a first electrode, a second electrode, and a gate, the gate of the fifth transistor being coupled with the second electrode of the first transistor and the first electrode of the fifth transistor being coupled with the first power source; and
   a sixth transistor having a first electrode, a second electrode, and a gate, the gate of the sixth transistor being coupled with the second electrode of the third transistor, the first electrode of the sixth transistor being coupled with the second electrode of the fifth transistor, and the second electrode of the sixth transistor being substantially grounded.

10. The transistor level shifter circuit of claim 9, wherein the second amplifying circuit comprises:
   a seventh transistor having a first electrode, a second electrode, and a gate, the gate of the seventh transistor being coupled with the second electrode of the fifth transistor, the first electrode of the seventh transistor being coupled with the first power source;
   an eighth transistor having a first electrode, a second electrode, and a gate, the gate of the eighth transistor receiving the inverse clock signal, the first electrode of the eighth transistor being coupled with the second electrode of the seventh transistor, and the second electrode of the eighth transistor being coupled with the second power source;
   a ninth transistor having a first electrode, a second electrode, and a gate, the gate of the ninth transistor being coupled with the second electrode of the fifth transistor, the first electrode of the ninth transistor being coupled with the first power source, and the second electrode of the ninth transistor outputting the output signal; and
   a tenth transistor having a first electrode, a second electrode, and a gate, the gate of the tenth transistor being coupled with the second electrode of the seventh transistor, the first electrode of the tenth transistor being coupled with the second electrode of the ninth transistor, and the second electrode of the tenth transistor being coupled with the second power source.

11. The transistor level shifter circuit of claim 9, wherein the first amplifying circuit comprises:
   a seventh transistor having a first electrode, a second electrode, and a gate, the gate of the seventh transistor being coupled with the second electrode of the second transistor and the first electrode of the seventh transistor being coupled with the first power source;
   an eighth transistor having a first electrode, a second electrode, and a gate, the gate of the eighth transistor receiving the inverse clock signal, the first electrode of the eighth transistor being coupled with the second electrode of the seventh transistor; the second electrode of the eighth transistor being substantially grounded;
   a ninth transistor having a first electrode, a second electrode, and a gate, the gate of the ninth transistor being coupled with the second electrode of the second transistor and the first electrode of the ninth transistor being coupled with the first power source; and
   a tenth transistor having a first electrode, a second electrode, and a gate, the gate of the tenth transistor being coupled with the second electrode of the seventh transistor, the first electrode of the tenth transistor being coupled with the second electrode of the ninth transistor, and the second electrode of the tenth transistor being substantially grounded.

12. The transistor level shifter circuit of claim 11, wherein the second amplifying circuit comprises:
   an eleventh transistor having a first electrode, a second electrode, and a gate, the gate of the eleventh transistor being coupled with the second electrode of the fifth transistor and the first electrode of the eleventh transistor being coupled with the first power source;
   a twelfth transistor having a first electrode, a second electrode, and a gate, the gate of the twelfth transistor being coupled with the second electrode of the ninth transistor, the first electrode of the twelfth transistor being coupled with the second electrode of the eleventh transistor, and the second electrode of the twelfth transistor being coupled with the second power source;
   a thirteenth transistor having a first electrode, a second electrode, and a gate, the gate of the thirteenth transistor being coupled with the second electrode of the fifth transistor, the first electrode of the thirteenth transistor being coupled with the first power source, and the second electrode of the thirteenth transistor outputting the output signal; and
   a fourteenth transistor having a first electrode, a second electrode, and a gate, the gate of the fourteenth transistor being coupled with the second electrode of the eleventh transistor, the first electrode of the fourteenth transistor being coupled with the second electrode of the thirteenth transistor, and the second electrode of the fourteenth transistor being coupled with the second power source.

* * * * *